United States Patent [19]

Lin et al.

[11] Patent Number: 5,334,543
[45] Date of Patent: Aug. 2, 1994

[54] METHOD OF MAKING REVERSE LIGHTLY DOPED DRAIN (LDD) FOR BURIED N+ CONDUCTOR

[75] Inventors: Jyh-Kuang Lin, I-Lan; Nai J. Yeh, Hsinchu, both of Taiwan

[73] Assignee: United Microelectronics Corporation, Hsinchu, Taiwan

[21] Appl. No.: 142,140

[22] Filed: Oct. 28, 1993

[51] Int. Cl.⁵ ................................ H01L 21/266
[52] U.S. Cl. ................................ 437/30; 437/44; 437/45
[58] Field of Search ............... 437/28, 29, 30, 44, 437/45

[56] References Cited

U.S. PATENT DOCUMENTS

| | | | |
|---|---|---|---|
| 4,780,424 | 10/1988 | Holler et al. | 437/30 |
| 4,994,404 | 2/1991 | Sheng et al. | 437/44 |
| 5,073,514 | 12/1991 | Ito et al. | 437/44 |
| 5,278,078 | 1/1994 | Kanebako et al. | 437/45 |

OTHER PUBLICATIONS

VLSI Technology, International Edition, by S. M. SZE, McGraw-Hill Book Co, pp. 476–482, 1983.

*Primary Examiner*—Tom Thomas
*Assistant Examiner*—Chandra Chaudhari
*Attorney, Agent, or Firm*—George O. Saile; Graham S. Jones

[57] ABSTRACT

A silicon semiconductor device has buried conductor lines formed therein. A layer of gate oxide, conductive structures, and spacer structures adjacent to the conductive structures on the gate oxide layer are formed. The substrate has implanted dopant ions of a relatively low level of surface concentration in the semiconductor material below the remainder of the conductive structures. The substrate has implanted dopant ions of a relatively medium level of surface concentration in the semiconductor material below the spacer structures. The substrate has implanted dopant ions of a relatively high level of surface concentration in the semiconductor material below the remainder of the substrate. Thus leakage is reduced by the profile of surface concentration of dopant in the semiconductor material of the substrate.

11 Claims, 8 Drawing Sheets

METHOD OF MAKING REVERSE LIGHTLY DOPED DRAIN (LDD) FOR BURIED N+ CONDUCTOR

BACKGROUND OF THE INVENTION

1. Field of the Invention

This invention relates to MOSFET devices and more particularly to buried conductors.

2. Description of Related Art

In the fabrication of semiconductor devices, during ion implantation, standard threshold voltage VT adjustment is lost during the processing which follows the early ion implantation step. There is a loss of boron from the wafer because of outgassing of the boron during processes subsequent to the initial ion implantation step. The loss of boron is a problem because it causes a leakage path. This is described in greater detail with reference to FIGS. 13, 14A-14D, 15 and 16.

SUMMARY OF THE INVENTION

A silicon semiconductor device comprising,
a) a substrate composed of a semiconductor material,
b) a plurality of buried conductors lines in the silicon substrate with silicon dioxide structures formed on the surface thereof,
c) a layer of gate oxide above the substrate,
d) a plurality of conductive structures formed above the gate oxide layer,
e) spacer structures formed adjacent to the conductive structures on the gate oxide layer,
f) the substrate has implanted dopant ions of a relatively low level of surface concentration in the semiconductor material below the conductive structures,
g) the substrate has implanted dopant ions of a relatively medium level of surface concentration in the semiconductor material below the spacers structures,
h) the substrate has implanted dopant ions of a relatively high level of surface concentration in the remainder of the substrate,
whereby leakage is reduced by the profile of surface concentration of dopant in the semiconductor material of the substrate.

Further in accordance with this invention, a silicon semiconductor device and its method of fabrication are provided by the steps comprising
a) forming a plurality of buried conductor lines in a semiconductor substrate with silicon dioxide structures formed on the surface thereof,
b) primary implanting of dopant ions into the surface of the substrate,
c) forming a layer of gate oxide above the substrate,
d) forming a plurality of conductive structures above the gate oxide layer,
e) secondary implanting of dopant ions into the surface of the substrate,
f) forming spacer structures adjacent to the conductive structures on the gate oxide layer,
g) forming thermal oxidation on the substrate, and
h) tertiary implanting of dopant ions into the surface of the semiconductor material,
whereby leakage is reduced by the profile of surface concentration of dopant in the semiconductor material of the substrate.

Preferably, the chemical species of the dopant implanted in the primary implanting comprises boron (B) with a dose of between about 1E12 cm$^{-2}$ and about 5E12m$^{-2}$, at an energy of between about 50 keV and about 60 keV in an implanter type of tool providing a surface concentration of between about $1 \times 10^{17}$ cm$^{-3}$ and about $5 \times 10^{17}$ cm$^{-3}$. The chemical species of the dopant implanted in the secondary implanting comprises BF$_2$ with a dose of between about 1E12 cm$^{-2}$ and about 5E12 cm$^{-2}$, at an energy of between about 50 keV and about 60 keV in a low current implanter type of tool providing a surface concentration of between about $1 \times 10^{17}$ cm$^{-3}$ and about $5 \times 10^{17}$ cm$^{-3}$. The chemical species of the dopant implanted in the tertiary implanting comprises BF$_2$ with a dose of between about 1E13 cm$^{-2}$ and about 3E13 cm$^{-2}$, at an energy of between about 50 keV and about 70 keV in a low current implanter type of tool providing a concentration of between about $1 \times 10^{18}$ cm$^{-3}$ and about $3 \times 10^{18}$ cm$^{-3}$.

It is also preferred that the conductive structures are composed of polysilicon and have a thickness within the range between about 2500 Å and about 6000 Å.

Another preferred step in fabrication of an semiconductor device wherein the conductive structures are covered with a dielectric film.

The spacers are formed by LTO deposition, densifying, and etching and then the device is subjected to an oxidation step within the range from about 850° C. to about 950° C. with a thickness of from about 200Å to about 220Å.

BRIEF DESCRIPTION OF THE DRAWINGS

The foregoing and other aspects and advantages of this invention are explained and described below with reference to the accompanying drawings, in which:

FIG. 5B is a section of the device in FIG. 5A taken spaced a distance away from the oxide structures.

DESCRIPTION OF THE PREFERRED EMBODIMENT

Figure 1:
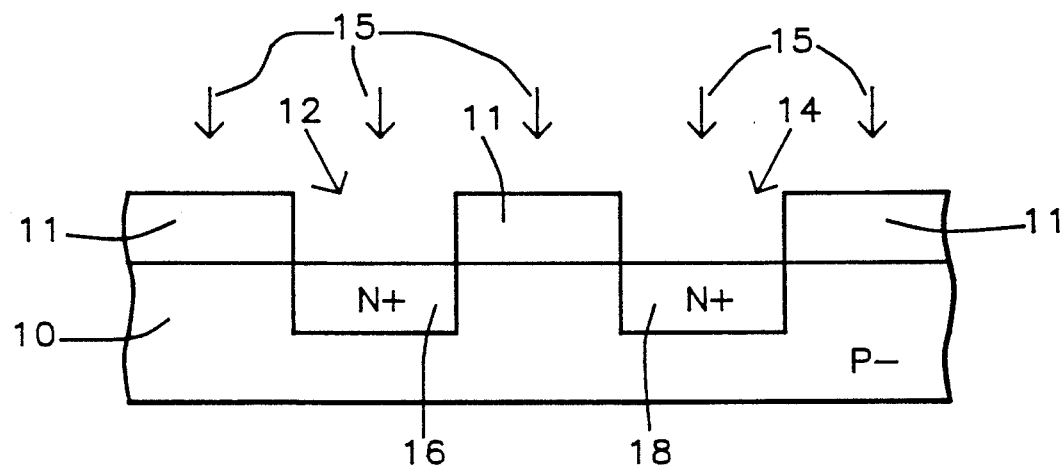
FIG. 1 shows a semiconductor substrate showing an implantation step into a workpiece being fabricated in accordance with this invention.

FIG. i shows a semiconductor substrate 10 comprising a workpiece being fabricated in accordance with this invention. The substrate 10 doped P— is masked with a photoresist layer 11 patterned with openings 12 and 14 defining openings for ion implantation of N+ dopant to form buried bitline N+ regions 16 and 18. The lithographic process commences by spinning photoresist 11 on top of substrate 10, where it is exposed to a master mask pattern and developed as is well known by those skilled in the art. Then, buried N+ ions are ion implanted into local regions 16 and 18 having a thickness of between about 300Å and about 800Å in the substrate 10 through openings 12 and 14, (where the photoresist layer 11 does not provide a shield.) The chemical species of the dopant implanted is arsenic ($As^{75}$) with a dose within an operable range of between about 4E15 $cm^{-2}$ and about 8E15 $cm^{-2}$ at an energy of between about 70 keV and about 100 keV in a high current implanter type of tool. The optimum dosages comprise a range of between about 5E15 $cm^{-2}$ and about 6 E 15 $cm^{-2}$, resulting in a concentration of As dopant between about $1 \times 10^{19}$ $cm^{-3}$ and about $1 \times 10^{21}$ $cm^{-3}$.

Figure 2:
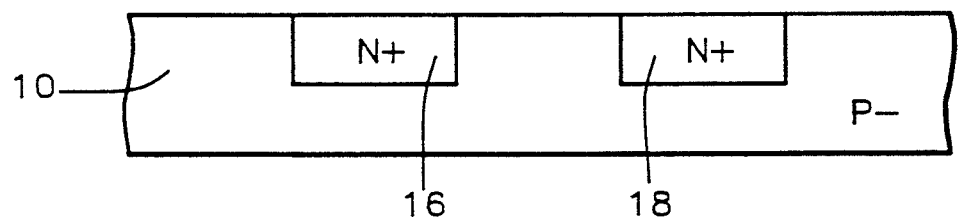
FIG. 2 shows the workpiece of FIG. 1, after a photoresist mask has been removed.

Referring to FIG. 2, after the implantation step in FIG. 1, the photoresist mask 11 is removed.

Figure 3:
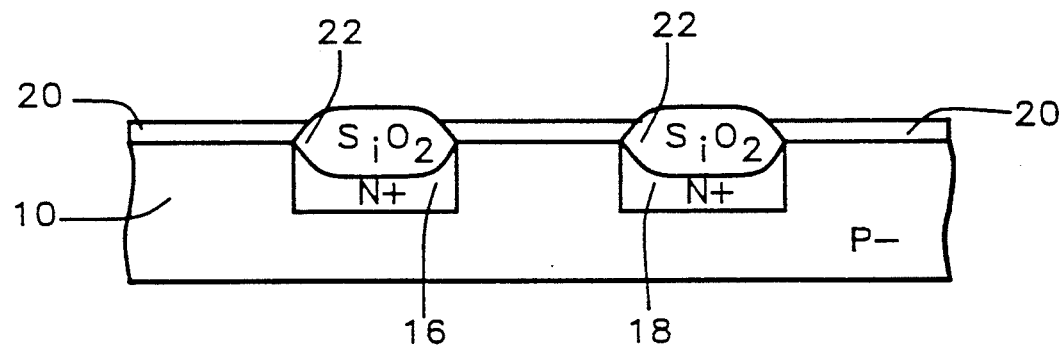
FIG. 3 shows the product of FIG. 2 after exposure to thermal oxidation in oxygen O$_2$ with the regions with the higher concentrations of dopant forming thicker oxide structures.

Referring to FIG. 3, the product of FIG. 2 has been exposed to thermal oxidation in oxygen $O_2$ with the regions 16 and 18 with the higher concentrations of dopant forming thicker oxide structures 22 above the buried bitline regions 16 and 18 having a thickness of between about 1000Å and about 1500Å in regions surrounding the regions 16 and 18 and a thinner layer 20 of oxide preferably having a thickness of between about 200Å and about 250Å.

Figure 4:
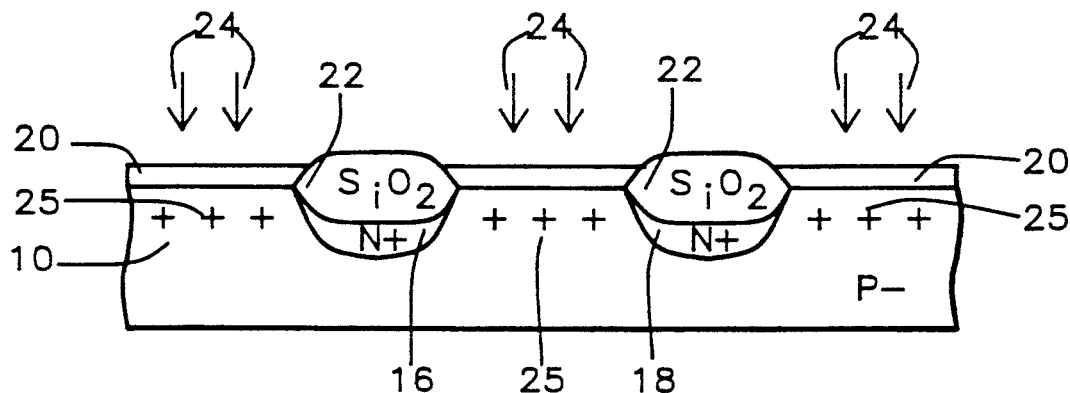
FIG. 4 shows the product of FIG. 3 after a blanket ion implantation step for implanting dopant into the substrate.

Referring to FIG. 4, in a blanket ion implantation step $BF_2$ 24 is implanted into the substrate 10 to a depth of between about 500Å and about 700Å in the substrate 10 for the purpose of adjustment of the threshold voltage $V_T$, which is the voltage required at the gate to achieve conduction between the source and drain, i.e. to switch the MOSFET to an on condition. The chemical species of the dopant implanted is $BF_2$ with a dose within an operable range of between about 1E12 $cm^{-2}$ and about 5E12 $cm^{-2}$ at an energy of between about 50 keV and about 60 keV in a high current implanter type of tool. The optimum dosages comprises a range of between about 2E12 $cm^{-2}$ and about 3E12 $cm^{-2}$, resulting in a concentration of boron between about $1 \times 10^{17}$ $cm^{-3}$ and about $5 \times 10^{17}$ $cm^{-3}$.

The threshold voltage $V_T$ implantation is a general type of process step which is widely used and accordingly it will be well understood by those skilled in the art.

Figure 5A:
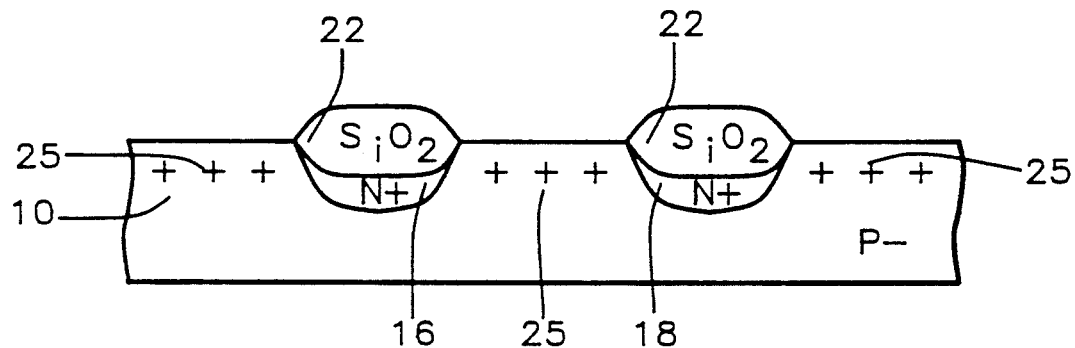
In FIGS. 5A and 5B, the product of FIG. 4 has been processed further by the removal of a silicon dioxide layer by a conventional etching process.
Figure 5B:
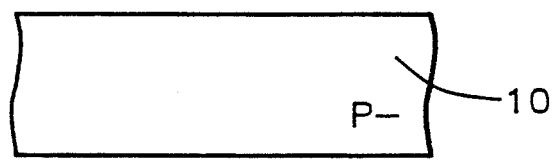

In FIGS. 5A and 5B, the product of FIG. 4 has been processed further by the removal of silicon dioxide layer 20 by a conventional etching process. FIG. 5B is a section of the device in FIG. 5A taken spaced a distance away from the structures 22.

Figure 6A:
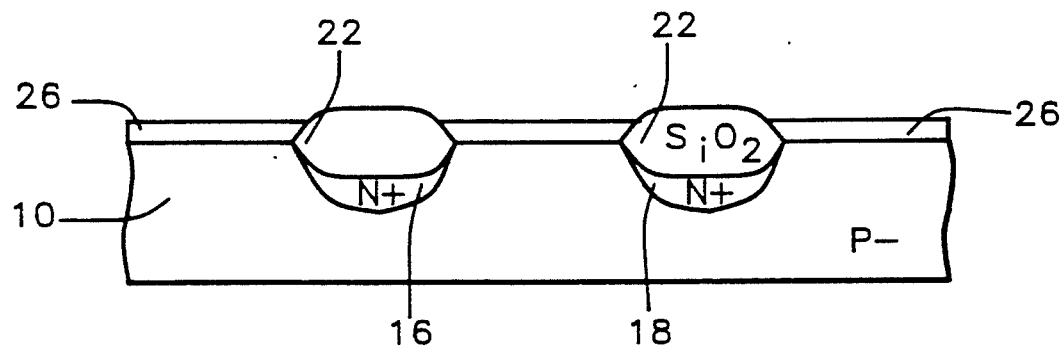
In FIGS. 6A and 6B, the products of FIGS. 5A and 5B are shown after an additional step has been performed of applying a gate oxide layer over the portions of the device where structures are absent. The gate oxide is formed by means of a conventional process.
Figure 6B:
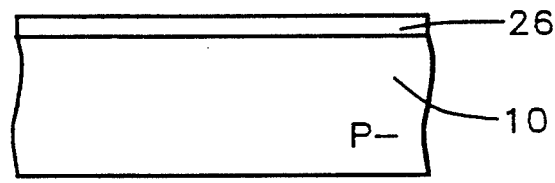

In FIGS. 6A and 6B, the products of FIGS. 5A and 5B are shown after an additional step has been performed of applying a gate oxide layer 26 over the portions of the device where structures 22 are absent. The gate oxide is formed by means of a conventional process.

Figure 7A:
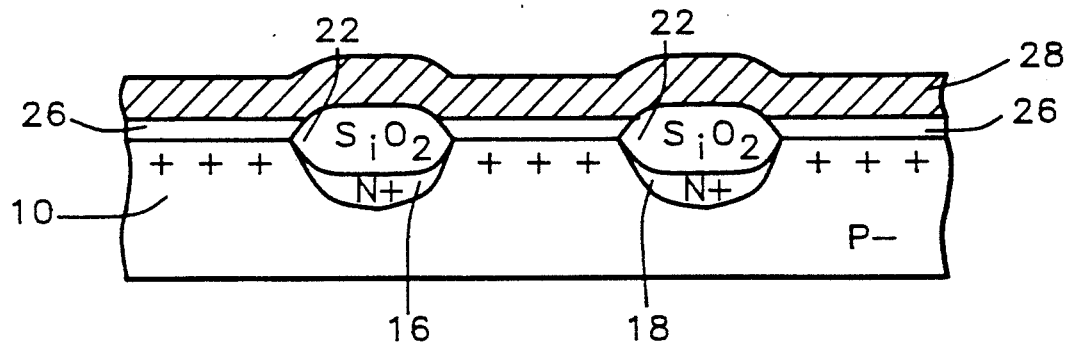
In FIGS. 7A and 7B, the product of FIGS. 6A and 6B is further coated with an electrically conductive, polysllicon structure.
Figure 7B:
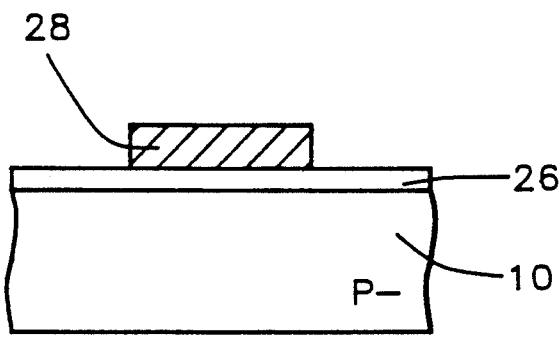

In FIGS. 7A and 7B, the product of FIGS. 6A and 6B is further coated with an electrically conductive, polysilicon structure 28 formed by means of a conventional process preferably having a thickness of about 3000 Å and within the range of between about 2500Å and about 6000Å.

Figure 8A:
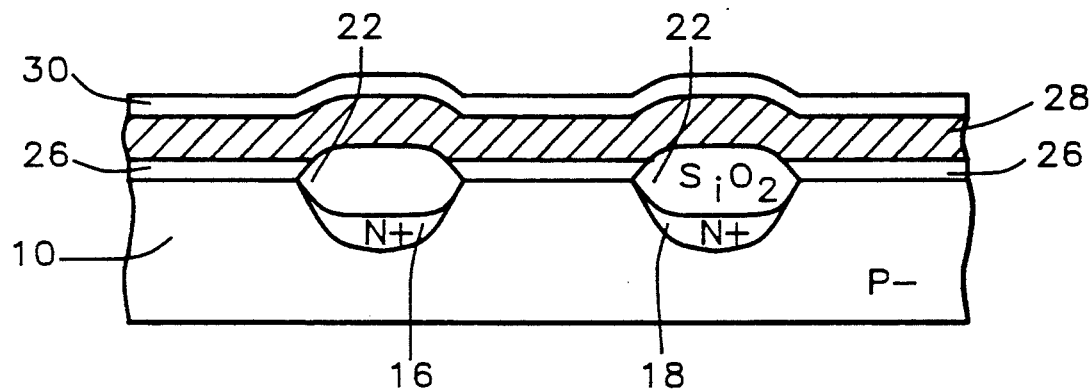
In FIGS. 8A and 8B, the product of FIGS. 7A and 7B is further coated with a layer of silicon dioxide (which is frequently referred to as oxide) formed by means of a conventional process.
Figure 8B:
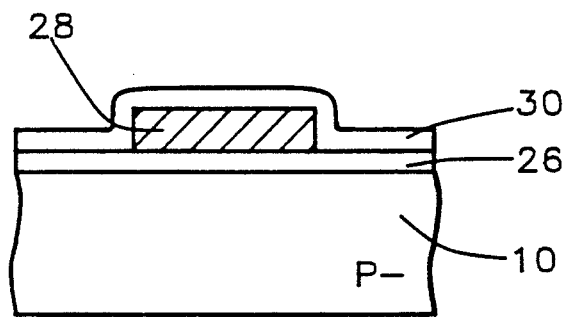

In FIGS. 8A and 8B, the product of FIGS. 7A and 7B is further coated with a layer 30 of silicon dioxide (which is frequently referred to as oxide) formed by means of a conventional process.

Figure 9:
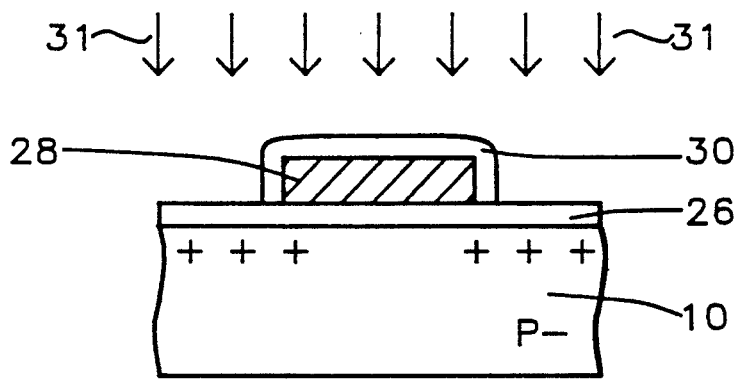
In FIG. 9, the product of FIGS. 8A and 8B is further processed by an optional cell isolation step in which a step of ion implantation is performed with BF$_2$ in the region to the left of the polysilicon.

In FIG. 9, a product of FIGS. 8A and 8B is further processed by an optional cell isolation step in which a step of $BF_2$ ion implantation, which is performed with dopant ions $BF_2$ 31 in the regions to the left and right of polysilicon structure 28. The chemical species of the dopant implanted is $BF_2$ with a dose within an operable range of between about 1E12 $cm^{-2}$ and about 5E12 $cm^{-2}$ at an energy of between about 50 keV and about 70 keV in a low current implanter type of tool. The optimum dosages comprises a range of between about 2E 12 $cm^{-2}$ and about 3E12 $cm^{-2}$, resulting in a concentration of boron between about $1 \times 10^{17}$ $cm^{-3}$ and about $5 \times 10^{17}$ $cm^{-3}$.

Figure 10:
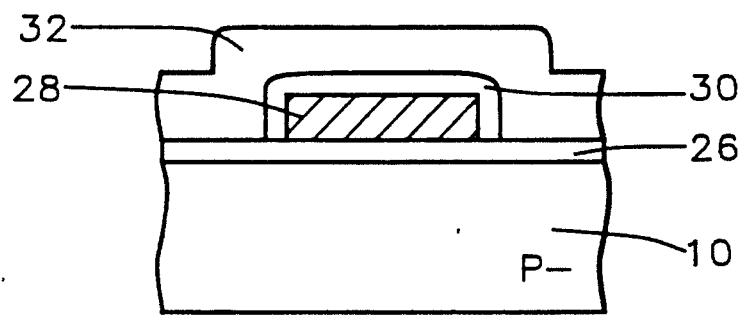
FIG. 10 shows the product of FIG. 9 with a relatively thick layer of silicon dioxide SiO$_2$ is formed over the product of FIG. 9 by chemical vapor deposition (CVD) of silane ($SiH_4$) forming an LTO (Low Temperature Oxide)s.

In FIG. 10, a relatively thick layer 32 of silicon dioxide (SiO$_2$) is formed over the product of FIG. 9 by chemical vapor deposition (CVD) of silane (SiH$_4$) forming an LTO (Low Temperature Oxide)s. Layer 32 has a thickness of between about 1800 Å and about 2200 Å with a preferred thickness of about 2000 Å. The temperature range of this process is between about 500° C. and about 700° C. with a preferred temperature of about 600° C.

The advantage of using an LTO process known as the LDD process in this step is that the resulting MOSFET product is improved in that the device breakdown voltage is improved and the hot carrier degradation is suppressed.

Next, the product of FIG. 10 is densified by heating in nitrogen (N$_2$) gas at a temperature between about 850° C. and about 950° C. The purpose of densifying is to improve the oxide integrity. In other words, the process of densifying provides the advantage of better adhesion behavior.

Figure 11:
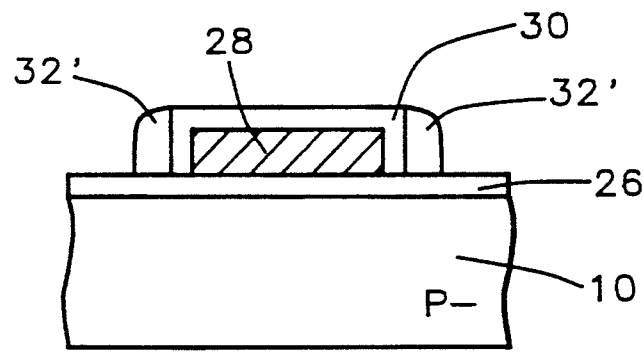
FIG. 11 shows the densified product of FIG. 10 etched to convert the silicon dioxide layer into spacers.

Next, as shown in FIG. 11, the densified product of FIG. 10 is etched to convert the layer 32 into spacers 32'. The etchant employed is preferably an anisotropic dry etchant. The preferred etchants for the silicon dioxide layer 32 is a dry chemical which is an anisotropic etchant allowing the spacers to remain while the remainder of the silicon dioxide is etched away.

After the process step shown in FIG. 11, an additional oxidation step is performed to achieve the advantage of shielding the silicon surface for a subsequent implantation by the process of thermal oxidation within the temperature range between about 850° C. and about 950° C. with a thickness between about 200 Å and about 220 Å.

Figure 12:
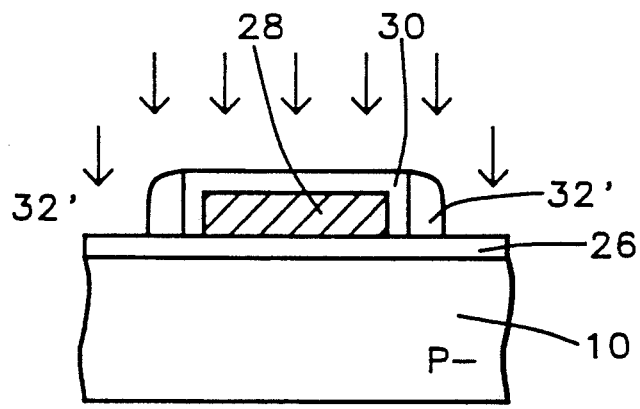
FIG. 12 shows an additional ion implantation cell isolation step being performed.

Referring to FIG. 12 an additional ion implantation cell isolation step is performed. The chemical species of the dopant implanted is BF$_2$ with a dose within an operable range of between about 1E13 cm$^{-2}$ and about 3E13 cm$^{-2}$ at an energy of between about 50 keV and about 70 keV in a low current implanter type of tool. The optimum dosages comprises a range of between about 1.5E13 cm$^{-2}$ and about 2E13 cm$^{-2}$, resulting in a concentration of boron between about $1 \times 10^{18}$ cm$^{-3}$ and about $3 \times 10^{18}$ cm$^{-3}$.

Figure 13:
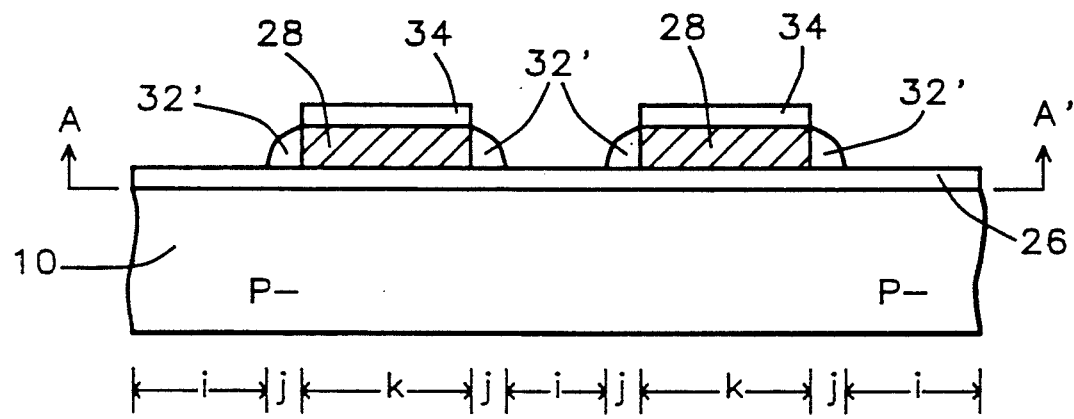
FIG. 13 is a sectional view of a device in accordance with this invention. The section shown is taken along line A—A' in FIG. 15. The regions "i", "J" and "k" have different levels of surface concentration of dopant, as shown from FIG. 14A to FIG. 14D, which vary depending upon the method employed of fabricating the device shown in FIG. 13.

Referring to FIG. 13, a sectional view is shown of a device in accordance with this invention. The sectional view shown is taken along line A—A' in FIG. 15. The substrate 10 is shown with P— dopant having gate oxide 26 preferably having a thickness of about 200 Å and within the range of between about 180Å and about 200Å, gate 28 preferably having a thickness of about 3000 Å and within the range of between about 2500Å and about 4000Å, spacers 32', and a dielectric layer, preferably comprising a silicon dioxide layer 34, preferably having a thickness of about 400 Å and within the range of between about 350Å and about 500Å. Varying levels of dopant in the device of FIG. 13 are designated as regions "i", "J" and "k", shown as they repeat in a pattern across the device. The regions "i", "J" and "k" have different levels of surface concentration of dopant, as shown from FIG. 14A to FIG. 14D, which vary depending upon the method employed of fabricating the device shown in FIG. 13.

Figure 14A:
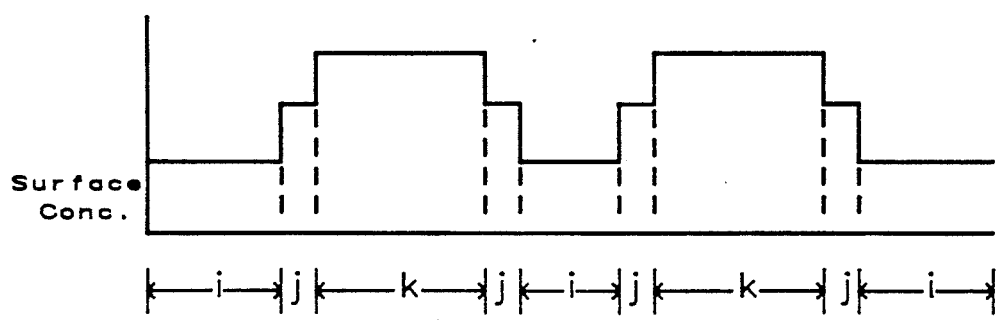
FIG. 14A shows the surface concentration of a cell without the cell isolation ion implantation step 1 shown in FIG. 9 and without the cell isolation ion implantation step 2 shown in FIG. 12, which has the disadvantage that it is leaky in the regions "i" and "J", where the surface concentration is low.

FIG. 14A shows the surface concentration of a cell without the cell isolation ion implantation step 1 shown in FIG. 9 and without the cell isolation ion implantation step 2 shown in FIG. 12, which has the disadvantage that it is leaky in the regions "i" and "J", where the surface concentration is low.

Figure 14B:
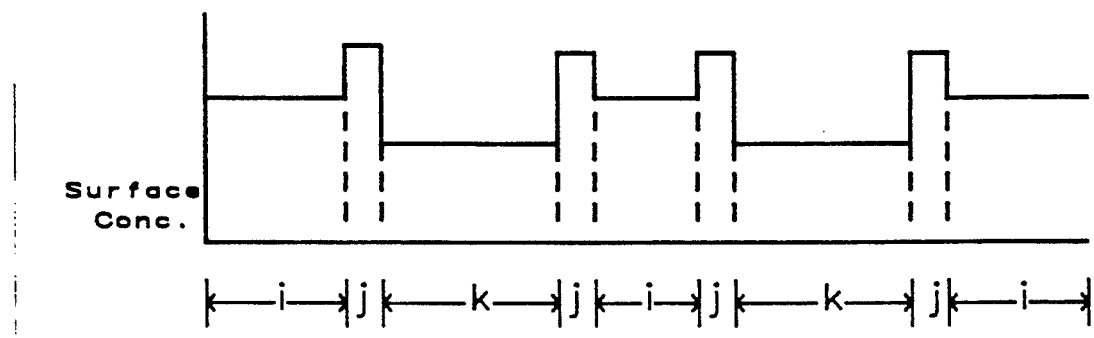
FIG. 14B shows the surface concentration of a cell with the cell isolation ion implantation step 1 shown in FIG. 9 but without the cell isolation ion implantation step 2 shown in FIG. 12, which overcomes the leakage problem, but the heavy doping in region "J" encroaches on the channel region "k" resulting in a decreased channel width, along with a decrease in current. Moreover the Junction breakdown voltage is also decreased.

FIG. 14B, shows the surface concentration of a cell with the cell isolation ion implantation step 1 shown in FIG. 9 but without the cell isolation ion implantation step 2 shown in FIG. 12, which overcomes the leakage problem, but the heavy doping in region "J" encroaches on the channel region "k" resulting in a decreased channel width, along with a decrease in current. Moreover the Junction breakdown voltage is also decreased.

Figure 14C:
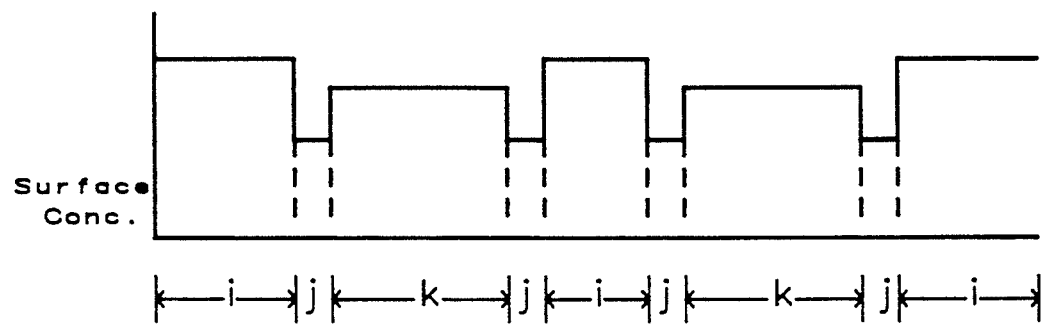
FIG. 14C shows the surface concentration of a cell without the cell isolation ion implantation step 1 shown in FIG. 9, but with the cell isolation ion implantation step 2 shown in FIG. 12 which has the problem that it is leaky in region "J", where the surface concentration can be seen to be very low.

FIG. 14C, shows the surface concentration of a cell without the cell isolation ion implantation step 1 shown in FIG. 9, but with the cell isolation ion implantation step 2 shown in FIG. 12 which has the problem that it is leaky in region "J", where the surface concentration can be seen to be very low.

Figure 14D:
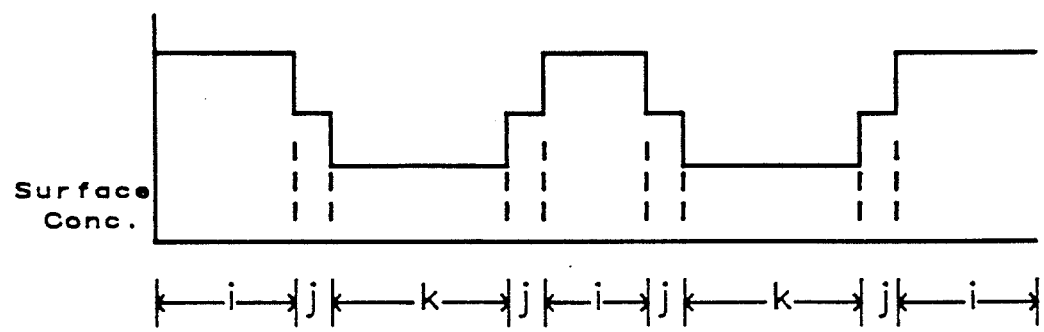
FIG. 14D shows the surface concentration of a cell with the cell isolation ion implantation step 1 shown in FIG. 9 and with the cell isolation ion implantation step 2 shown in FIG. 12. This provides an optimized design which eliminates the leakage problems of the designs of FIG. 14A and FIG. 14C and the channel width, current and Junction breakdown voltage problems of FIG. 14B. The surface concentration is highest in the region "i" and lowest in the region "k".

FIG. 14D, shows the surface concentration of a cell with the cell isolation ion implantation step 1 shown in FIG. 9 and with the cell isolation ion implantation step 2 shown in FIG. 12. This provides an optimized design which eliminates the leakage problems of the designs of FIG. 14A and FIG. 14C and the channel width, current and Junction breakdown voltage problems of FIG. 14B. The surface concentration is highest in the region "1" and lowest in the region "k".

Figure 15:
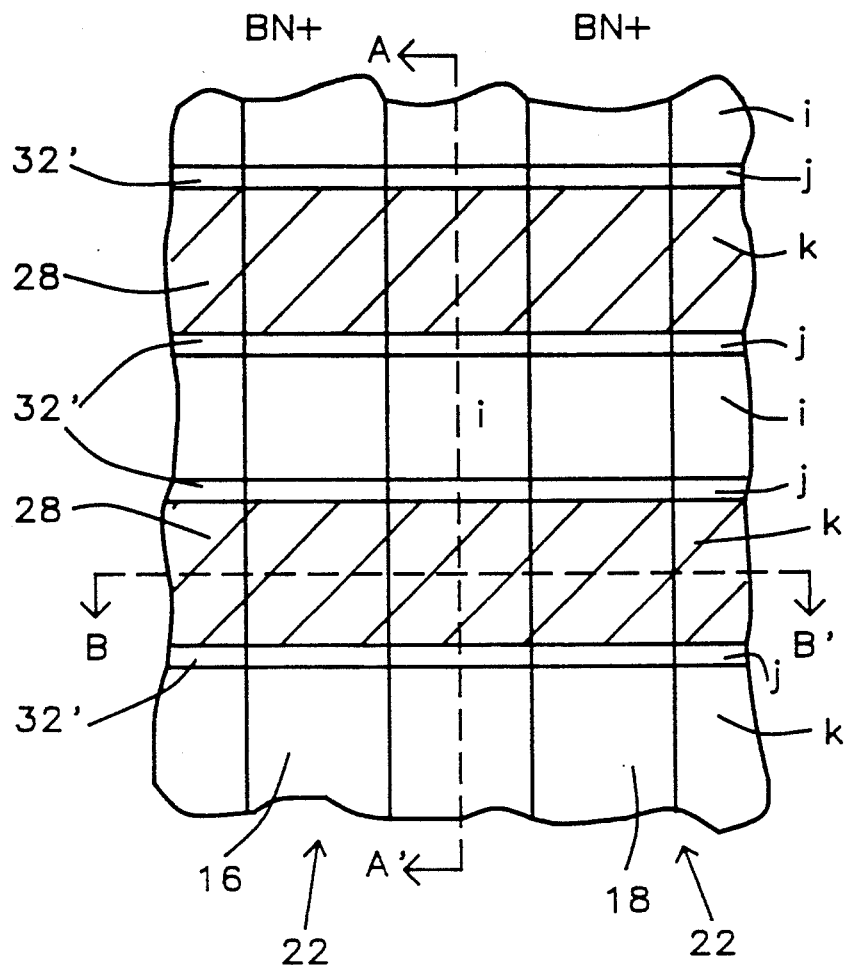
FIG. 15 is a plan view of the device of FIG. 13.

FIG. 15 is a plan view of the device of FIG. 13.

Figure 16:
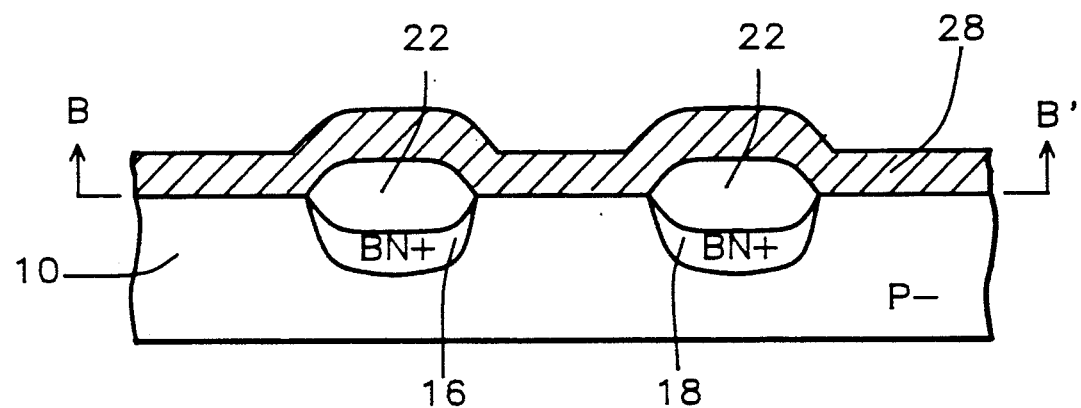
FIG. 16 shows a sectional view of the device of FIGS. 13 and 15 taken along line B—B in FIG. 15.

FIG. 16 shows a sectional view of the device of FIGS. 13 and 15 taken along line B—B in FIG. 15. The substrate 10 includes buried bit lines 16 and 18 and silicon dioxide structures 22 formed in the surface thereof as described above in connection with FIG. 3. The electrically conductive, polysilicon structures 28 pass at right angles across the top of the buried bit lines 16 and 18 as well as the silicon dioxide structures 22 formed therein.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of fabrication of an semiconductor device comprising
   a) forming a plurality of buried conductor lines in a semiconductor substrate with silicon dioxide structures formed by thermal oxidation on the surface thereof,
   b) primary implanting of dopant ions into the surface of said substrate,
   c) forming a layer of gate oxide above said substrate,
   d) forming a plurality of conductive structures above said gate oxide layer,
   e) secondary implanting of dopant ions into the surface of said substrate,
   f) forming spacer structures adjacent to said conductive structures on said gate oxide layer,
   g) forming thermal oxidation on said substrate, and
   h) tertiary implanting of dopant ions into the surface of said semiconductor material, whereby leakage is reduced by said profile of surface concentration of dopant in said semiconductor material of said substrate.

2. A method in accordance with claim 1 wherein the chemical species of the dopant implanted in said primary implanting comprises boron (B) with a dose of between about 1E12 cm$^{-2}$ and about 5E12m$^{-2}$, at an energy of between about 50 keV and about 60 keV in an implanter providing a surface concentration of between about $1 \times 10^{17}$ cm$^{-3}$ and about $5 \times 10^{17}$ cm$^{-3}$.

3. A method in accordance with claim 2 wherein the chemical species of the dopant implanted in said secondary implanting comprises BF$_2$ with a dose of between about 1E12 cm$^{-2}$ and about 5E12 cm$^{-2}$, at an energy of between about 50 keV and about 60 keV in a low current implanter providing a surface concentration of between about $1 \times 10^{17}$ cm$^{-3}$ and about $5 \times 10^{17}$ cm$^{-3}$.

4. A method in accordance with claim 1 wherein the chemical species of the dopant implanted in said secondary implanting comprises BF$_2$ with a dose of between about 1E12 cm$^{-2}$ and about 5E12 cm$^{-2}$, at an energy of between about 50 keV and about 60 keV in a low current implanter providing a surface concentration of between about $1 \times 10^{17}$ cm$^{-3}$ and about $5 \times 10^{17}$ cm$^{-3}$.

5. A method in accordance with claim 1 wherein the chemical species of the dopant implanted in said tertiary implanting comprises BF$_2$ with a dose of between about 1E13 cm$^{-2}$ and about 5E13 cm$^{-2}$, at an energy of between about 50 keV and about 70 keV in a low current implanter providing a concentration of between about $1 \times 10^{18}$ cm$^{-3}$ and about $3 \times 10^{18}$ cm$^{-3}$.

6. A method of fabrication of a semiconductor device in accordance with claim 1 wherein said conductive structures are composed of polysilicon and have a thickness within the range between about 2500 Å and about 6000 Å.

7. A method of fabrication of a semiconductor device in accordance with claim 2 wherein said conductive structures are covered with a dielectric film.

8. A method of fabrication of a semiconductor device in accordance with claim 1 wherein said spacers are formed by LTO deposition, densifying, and etching.

9. A method of fabrication of a semiconductor device in accordance with claim 8 wherein said device is next subjected to an oxidation step within the range from about 850° C. to about 950° C. with a thickness of from about 200Å to about 220Å.

10. A method of fabrication of a semiconductor device in accordance with claim 9 wherein said spacers are formed by LTO deposition, densifying, and etching.

11. A method of fabrication of a semiconductor device in accordance with claim 10 wherein said device is next subjected to an oxidation step within the range from about 850° C. to about 950° C. with a thickness of from about 200Å to about 220Å.

* * * * *